United States Patent [19]

Richman

[11] 3,751,722

[45] Aug. 7, 1973

[54] MOS INTEGRATED CIRCUIT WITH SUBSTRATE CONTAINING SELECTIVELY FORMED RESISTIVITY REGIONS

[75] Inventor: Paul Richman, St. James, N.Y.

[73] Assignee: Standard Microsystems Corporation, Hauppauge, N.Y.

[22] Filed: Apr. 30, 1971

[21] Appl. No.: 138,915

[52] U.S. Cl. ..... 317/235 R, 317/235 B, 317/235 G, 317/235 AG

[51] Int. Cl. .......................... H01l 19/00, H01l 11/14

[58] Field of Search ...................... 317/235 B, 235 E, 317/235 F, 235 G, 235 AK

[56] References Cited

UNITED STATES PATENTS

| | | | |
|---|---|---|---|
| 3,450,961 | 6/1969 | Tsai | 317/235 |
| 3,607,469 | 9/1971 | Madden | 317/235 |
| 3,648,125 | 3/1972 | Peltzer | 317/235 |
| 3,354,360 | 11/1967 | Campagna et al. | 317/235 |
| 3,534,234 | 10/1970 | Clevenger | 317/235 |
| 3,544,858 | 12/1970 | Kooi | 317/235 |

FOREIGN PATENTS OR APPLICATIONS

| | | | |
|---|---|---|---|
| 1,191,911 | 5/1970 | Great Britain | 317/235 |

OTHER PUBLICATIONS

IBM Tech. Discl. Bul., "Use of the MOS Substrate as a Control Element" by McDowell, Vol. 10, No. 7, Dec. 1967 page 1032.

Philips Res. Repts., "Local Oxidation of Silicon . . ." by Appels et al., Vol. 125, April 1970, pages 118–132.

IBM Tech. Discl. Bul. "Making Monolithic Semiconductor Structures . . ." by Doo et al., Vol. 8, No. 4, Sept. 1965, pages 659–660.

*Primary Examiner*—Jerry D. Craig
*Attorney*—Sandoe, Hopgood & Calimafde

[57] ABSTRACT

An MOS integrated circuit including active devices and potential parasitic devices in which the threshold voltage at the active devices is relatively low, but is relatively high at the locations of the parasitic devices. One embodiment of the circuit includes a substrate and an epitaxial layer of the same polarity thereon, with the resistivity of the latter being significantly greater than that of the former. The high-resistivity epitaxial layer is present at the channel region of the active devices, but is not present at the locations of the parasitic devices. In a second embodiment of the invention, the circuit includes a substrate of high resistivity and selectively diffused regions with doping concentration significantly greater than in the substrate. The active devices are formed in the high resistivity regions and the parasitic devices are formed in the selectively diffused regions.

1 Claim, 10 Drawing Figures

Figure 1A:
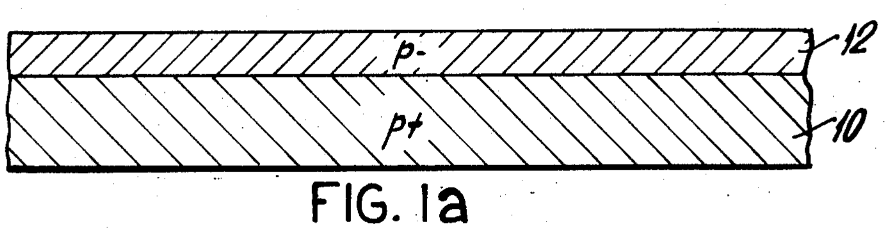
Figure 1B:
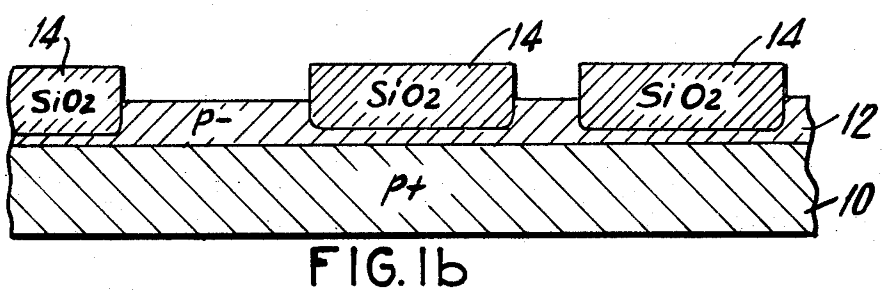

INVENTOR.
PAUL RICHMAN

BY

Sandoe, Hopgood & Calimafde
ATTORNEYS

INVENTOR.
PAUL RICHMAN
BY
Sandoe, Hopgood & Calimafde
ATTORNEYS

MOS INTEGRATED CIRCUIT WITH SUBSTRATE CONTAINING SELECTIVELY FORMED RESISTIVITY REGIONS

The present invention relates generally to semiconductor integrated circuits, and more particularly to an integrated circuit in which parasitic conduction is suppressed.

Great progress has been made in recent years in the design of MOS integrated circuits. These circuits have already found widespread acceptance particularly for use as computer memories of the random-access and permanent storage type. In a typical MOS integrated circuit, the active device is a field effect transistor (FET), which is fabricated by forming source and drain regions by selectively diffusing impurities of one polarity into a substrate of an opposite polarity.

In an insulated gate FET, a thin film of insulating material is thereafter formed over the channel between the source and drain regions, and a gate electrode is thereafter placed, such as by a deposition process, over the insulating film. The application of a control voltage of a proper polarity and value exceeding a threshold level causes inversion to occur within the channel and thus produces a conducting link between the source and drain regions. As a result, an FET may be advantageously employed as a switch for digital logic applications since the drain to source impedance can be varied over a wide range in response to a control voltage applied to the gate electrode.

In most MOS integrated circuits, diffusd drain, source and interconnection regions are formed in the substrate which are not intended to electrically interact with other diffused regions of the circuit; that is, these regions are considered as being non-related. A relatively thick silicon dioxide insulating layer is then formed over the non-related diffused regions and a conducting film may be formed over the insulating layer so that it overlies the semiconductor substrate region or channel between the non-related regions.

Should the voltage present on the conducting film exceed the threshold level at the channel between the non-related regions, channel inversion and conduction may result between these regions. This conduction, which is commonly designated as a parasitic conduction, is highly undesirable, particularly in an integrated logic circuit in which such parasitic conduction may cause the production of a signal of the incorrect logic sense at the circuit output. Non-related diffused regions across which this conduction may thus occur form a configuration which is commonly designated a parasitic device.

The degree of parasitic conduction is usually greater in n-channel MOS integrated circuits than it is in p-channel MOS integrated circuits since the ratio of parasitic field-inversion turn-on voltage to the active device threshold voltage is usually lower in the n-channel integrated circuit. As a result of this feature of n-channel MOS integrated circuits, the art has heretofore predominantly employed p-channel MOS integrated circuits even though the operating speed of n-channel integrated circuits is greater than that of the p-channel type of integrated circuit.

In the fabrication of an MOS integrated circuit and particularly in the fabrication of n-channel integrated circuits, great care must therefore be exercised to prevent parasitic conduction. To this end, the processing approach that is most commonly taken involves the establishment of a threshold voltage for a parasitic device at as high a value as is possible, and that for the active regions (FETs) at as low a value as is possible.

The threshold voltage at any region of an MOS integrated circuit is given by the following expression:

$$V_T=\left(\frac{-Q_{SS}-Q_{SD}}{\epsilon ox}\right)T_{ox} + \phi ms' + 2\phi F$$

where $V_T$ is the threshold voltage, $Q_{SS}$ and $Q_{SD}$ are charge densities, (the former being a fixed positive charge at the silicon substrate-oxide layer interface and the latter varying with the doping concentration in the substrate); $T_{ox}$ is the thickness of the oxide insulation layer, $\epsilon_{ox}$ is the dielectric constant of the oxide layer, $\phi ms'$ is the work function constant, and $\phi F$ is the Fermi potential associated with the silicon substrate.

From the above expression, it is seen that the threshold voltage is directly proportional to the oxide thickness, and, as a result, a common approach to the prevention of parasitic conduction has been to raise the threshold voltage of a parasitic region by increasing the oxide layer thereat, and to reduce the insulation film thickness at an active region, to thereby reduce the threshold voltage at the latter. The maximum oxide layer thickness that can be practically achieved is, however, limited by processing limitations and considerations of time and cost. The likelihood of parasitic conduction may also be reduced by lowering the voltage applied to the conducting film. This expedient would, however, have the adverse result of reducing the operating speed of the active devices.

As a result of these limitations, it has been proposed to selectively increase the charge density $Q_{SD}$ in the above equation at the parasitic regions and reduce this charge density at the active regions. The magnitude of the charge density $Q_{SD}$ in turn varies inversely with the substrate resistivity; that is, the charge density increases as the substrate resistivity decreases, and vice versa.

One approach that has been proposed to achieve this selective substrate charge density distribution is one which achieves selective doping of the substrate at the parasitic regions. This procedure in the past has required precise control during the impurity diffusion step, as well as the utilization of an additional masking step in the circuit fabrication process. These requirements adversely and significantly increase the cost and decrease the yield of integrated circuit fabrication.

Another technique for achieving selective charge distribution in the substrate is an ion implantation technique in which ions (e.g., boron or phosphorous, depending on the substrate polarity) are diffused into the substrate through an ion acceleration and focusing technique. This operation, however, requires the use of additional and expensive equipment, and significantly increases the time and cost of circuit fabrication, while at the same time decreasing the yield of acceptable integrated circuits.

Thus, while there has been a theoretical recognition in the art that parasitic conduction may be prevented by selectively varying the resistivity or charge density of regions in the substrate, there has heretofore not been a practical and economical manner in which to achieve this result. Since MOS technology is competing in the market with the more conventional bipolar integrated circuits, the maintenance of minimum fabrication costs and high yields of production is often a critical factor.

It is thus an object of the invention to provide an MOS integrated circuit in which parasitic conduction is effectively prevented.

It is a further object of the invention to provide an MOS integrated circuit in which the resistivity and charge density of selected substrate regions can be accurately achieved without the need for additional masking or other processing steps in the fabrication of the circuit.

In accord with the present invention, an MOS integrated circuit, according to one embodiment of the invention, includes a low-resistivity substrate of a given polarity on which is epitaxially grown a layer of the same polarity but of a significantly high resistivity. By a series of masking, etching, oxidizing, and diffusion steps, diffused regions of an opposite polarity are selectively formed in the epitaxial layer and substrate, and oxide insulating regions are formed above the substrate and epitaxial layer between selected diffused regions.

In a significant aspect of the integrated circuit, the channel between the active diffused regions is of the lower impurity concentration-high resistivity epitaxial layer material, whereas the channel between the non-related or parasitic regions is of the higher impurity concentration-lower resistivity substrate material. As a result, the threshold voltage at the active device (MOS transistor) is relatively low, and that at the parasitic area is high, as desired, to thereby achieve both high-speed active device operation and the suppression of parasitic conduction. In accordance with an alternate embodiment of the invention, a highly charged diffused region of a given polarity is formed in a substrate of that polarity and having a lower dopant concentration. The active devices are formed in mesas developed on the substrate and non-related and potentially parasitic regions are formed in other regions of the circuit. No part of the highly charged diffused region underlies the active region but underlies the parasitic regions to provide a low threshold voltage for the active regions and a substantially high threshold voltage for the parasitic regions.

Figure 1C:
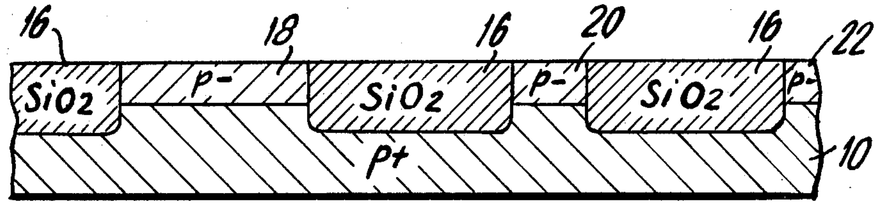
Figure 1D:
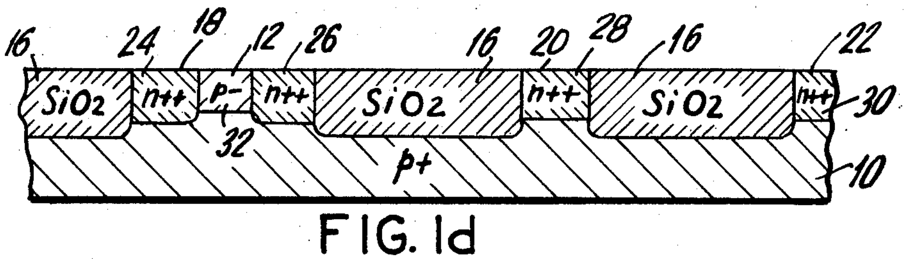
Figure 1E:
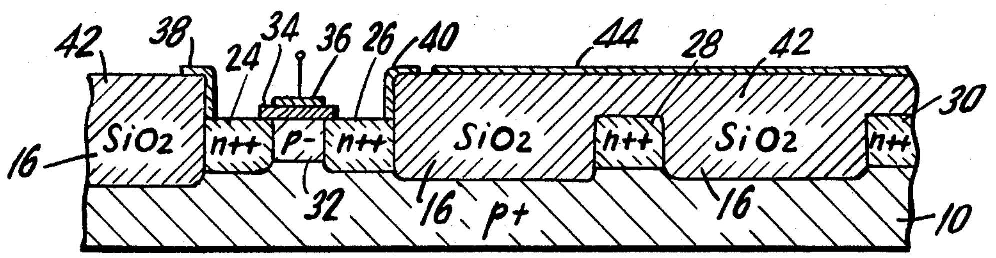
Figure 2A:
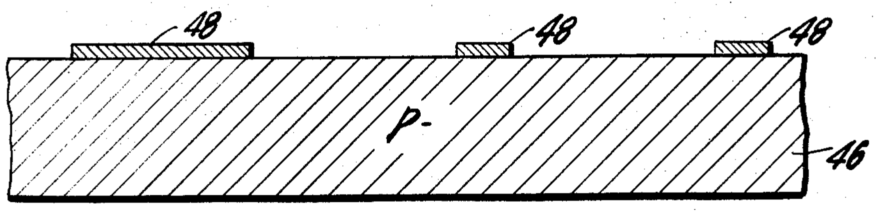
Figure 2B:
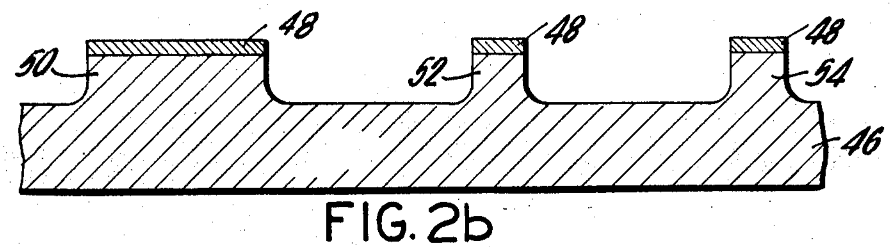
Figure 2C:
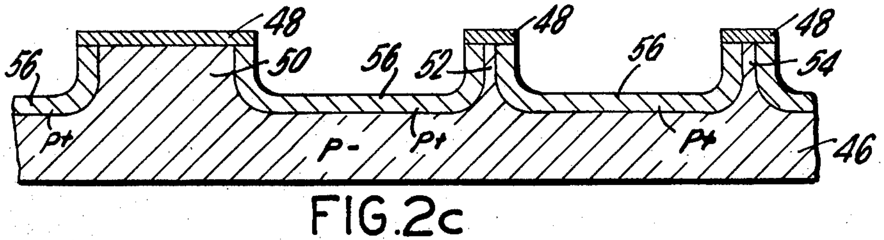
Figure 2D:
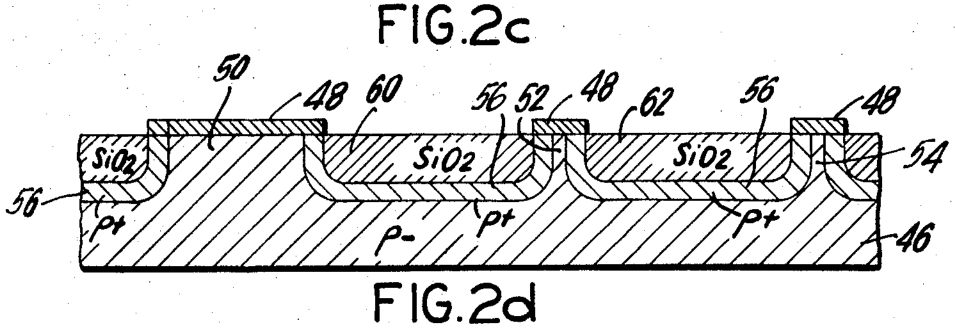
Figure 2E:
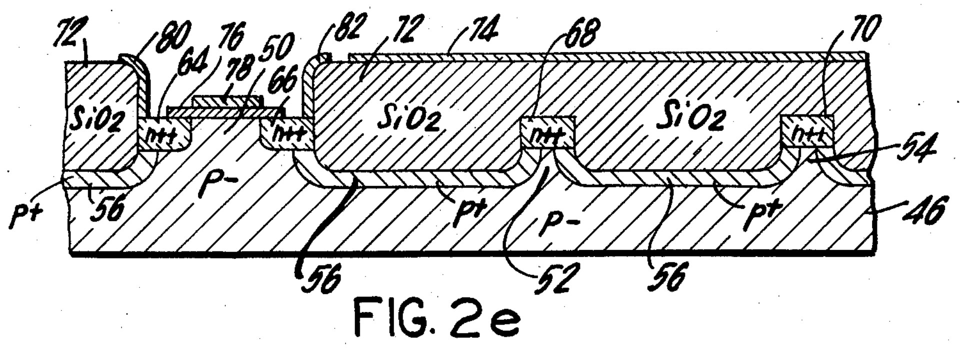

To the accomplishment of the above and to such further objects as may hereinafter appear, the present invention relates to an MOS integrated circuit and a method for fabricating the circuit, substantially as defined in the appended claims and as described in the following specification taken together with the accompanying drawings in which:

FIGS. 1*a* – 1*e* are cross-sectional views illustrating the basic steps in the fabrication of an MOS integrated circuit in accordance with one embodiment of the invention, a portion of the completed circuit being shown in cross-section in FIG. 1*e;* and FIGS. 2*a* – 2*e* are cross-sectional views illustrating the steps in the fabrication of an MOS integrated circuit according to a second embodiment of the invention, a portion of the completed circuit being shown in FIG. 2e.

Referring now to the drawing, the fabrication of the MOS integrated circuit of the invention begins with the provision of a p-type silicon substrate 10 on which an epitaxial layer 12 of between 1 and 2 microns in thickness is formed in a known manner. Substrate 10, as shown in FIG. 1a, is heavily doped with p-type impurities and has a relatively low resistivity in the order of 0.1 – 0.3 ohm-cm. In contrast, epitaxial layer 12 is doped to a lower concentration than the substrate and has a significantly higher resistivity in the order of 2.0 ohm-cm. The substrate with the epitaxial layer of FIG. 1*a* is then covered with a layer of silicon nitride which is selectively etched to provide a mask for the subsequent oxidation to form silicon dioxide regions 14, which extend both above and below the upper surface of epitaxial layer 12.

The silicon dioxide regions 14 are thereafter etched away by the use of hydrofluoric acid, and the device is subjected to a second oxidation operation to form silicon oxide regions 16. The upper level of oxide regions 16 extends approximately to the same level as the upper surface of the epitaxial layer, and regions 16 extend slightly below the interface of the substrate and epitaxial layer into the substrate as shown in FIG. 1*c*, to thereby define mesas or plateaus 18, 20, and 22, each of which, at this stage of fabrication, includes a high resistivity upper section corresponding to the portion of the epitaxial layer 12 remaining after the formation of oxide regions 16. The structure of FIG. 1*c* is then subjected to masking and diffusion operations in which n-type impurities are diffused into selected regions in mesas 18, 20, and 22 to form n-type diffused regions 24, 26, 28, and 30 as shown in FIG. 1*d*.

In the integrated circuit that is to be eventually fabricated, diffused regions 24 and 26 are designed to constitute the source and drain regions of an active device, to wit, a field-effect transistor, whereas regions 28 and 30 are to constitute interconnections which, in this case, are considered independent, non-related regions. That is, regions 28 and 30 define a non-related and potentially parasitic area for the reasons set forth above. It is the prime purpose of this invention to prevent the occurrence of parasitic conduction between diffused regions 28 and 30.

it will be noted that diffused regions 24 and 26 formed in mesa 18 are separated by a high-resistivity portion 32 remnant of the epitaxial layer, whereas the diffusion of the n-type impurities in mesas 20 and 22 is carried out in a manner such that the non-related diffused regions 28 and 30 are separated by a layer of thick oxide 16 and the underlying low-resistivity substrate 10.

In the completed MOS integrated circuit, shown in FIG. 1e, the field effect transistor is completed by forming a relatively thin gate insulation film 34 over the high-resistivity p-region 32 and extending partially over regions 24 and 26. A gate electrode 36 is formed by known means over insulation film 34, and source and gate electrodes 38 and 40 are connected, also in a known manner, to source and drain regions 24 and 26 respectively.

During the fabrication sequence, an additional silicon dioxide layer 42 is deposited onto the structure as shown in FIG. 1*e*, and a metallic conducting film or interconnect 44 is deposited on the upper surface of layer 42 to carry signal voltages to selected areas of the integrated circuit. It will be noted that conducting film 44 overlies the semiconductor substrate region or channel between non-related diffused regions 28 and 30, and it is the voltage on that conductive film that has the potential of producing the parasitic conduction between regions 28 and 30 for the reasons described above.

As noted above, in order for parasitic conduction to occur between regions 28 and 30, the voltage on conducting film 44 must exceed the threshold voltage of the parasitic device; that is, a voltage of a level capable of producing channel inversion in the substrate channel between these regions. Moreover, desired conduction between regions 24 and 26 will occur whenever the voltage on the gate electrode 36 exceeds the (active) threshold voltage necessary to produce channel inversion in the source-drain channel beneath the gate insulating film and the gate electrode.

As stated above, the value of the threshold voltage for the active and parasitic regions of the circuit are each a function of the charge density ($Q_{SD}$ in the equation) in the semiconductor channel between the diffused regions, and that charge density in turn varies inversely with the channel material resistivity. With this understanding, an examination of the integrated circuit of FIG. 1*e* clearly reveals the manner in which parasitic conduction between regions 28 and 30 is suppressed, while conduction between the source and drain regions (regions 24 and 26) of the thus-formed field effect transistor can be produced in response to a relatively low gate voltage.

That is, the channel region between the transistor source and drain regions consists of the high-resistivity, low-charge density epitaxial layer region 32, whereas the semiconductor channel between non-related diffused regions 28 and 30 underlying conducting film 44 is the low-resistivity, high charge-density substrate material—the lower resistivity epitaxial layer material at the parasitic area having been previously removed during the oxidation and diffusion operations in which regions 28 and 30 were formed, as previously described. As a result of this high charge-density region between regions 28 and 30 underlying conducting film 44 and the overall oxide layer thickness, the threshold voltage for the parasitic region may be readily set at a value far exceeding the maximum voltage anticipated to be produced on conducting film 44 during circuit operation.

To achieve the optimum, to wit, highest threshold voltage at the passive or parasitic region, the substrate impurity concentration should be at a maximum. That maximum value is, however, limited by the breakdown voltage of the p-n diode established at the interface between the substrate and the n-type drain diffused region 26, which in the circuit of the invention is primarily limited by the doping concentration in the substrate, which is the higher-resistivity side of the p-n junction.

The maximum value of the substrate impurity concentration is also limited by the maximum allowable value of parasitic junction capacitance between the n-type diffused drain region 26 and substrate 10. If the doping concentration in the substrate is too high, the parasitic capacitance associated with this and other similar junctions will seriously degrade the operating speed of the circuit.

A small reverse bias voltage may be applied to the substrate of a proper polarity so as to reverse bias all the junctions of the integrated circuit. Because the change in threshold voltage associated with an MOS transistor operating with such an applied substrate voltage varies directly with both the thickness of the gate insulator and the effective doping concentration at the surface of the silicon substrate in which the transistor is formed, it is thereby possible in the circuit of FIG. 1 to achieve an extremely large increase in the parasitic threshold voltage at the expense of only a very small increase in the threshold voltage of the active devices. The application of a reverse substrate voltage permits greater flexibility in selecting the doping concentration associated with the substrate, and also substantially reduces the parasitic junction capacitance. When this technique is used, care must be taken to insure that the maximum depletion region depth associated with the active devices is not greater than the thickness of the epitaxial layer 12.

In the fabrication of the embodiment of the invention of FIG. 1, care must thus be exercised in selecting the substrate resistivity and some design compromise may be necessary to maintain a sufficiently high breakdown voltage at the p-n junction as well as an acceptable value of the drain substrate capacitance at that junction, or in the alternative,to apply a reverse substrate voltage to reduce that capacitance.

In the embodiment of the invention to be described below with respect to FIG. 2, the problem of parasitic junction capacitance is substantially avoided while still suppressing parasitic conduction and enabling high-speed switching operation at the active devices.

The fabrication of the MOS circuit of the second embodiment begins with the provision of a p-type silicon substrate 46 having a relatively high resistivity and low impurity concentration. A thin silicon nitride layer 48 is deposited over the surface of the substrate 46 and is patterned to define the active areas, to wit, the source, drain and gate of the field effect transistors as well as the interconnects and thin capacitors, if any (FIG. 2*a*)

Utilizing silicon nitride layer 48 as an oxidation mask, regions of silicon dioxide (not shown) of between 15,000 and 20,000 A. in thickness are grown on the substrate regions not covered by the silicon nitride layer. The silicon dioxide regions are then etched away by a solution of buffered hydrofluoric acid to achieve the structure illustrated in FIG. 2b in which silicon mesas 50, 52 and 54 of p-type silicon are defined on the substrate. This structure may alternatively be achieved by etching away the exposed silicon of substrate 46 to the desired depth by the use of a slow-acting silicon etch.

Silicon nitride layer 48 is thereafter used as a diffusion barrier in a diffusion operation by means of which a *p+* diffusion region 56 of a predetermined higher impurity concentration and lower resistivity as compared to the substrate is formed at the upper exposed surface of the substrate and along the side walls of mesas 50, 52 and 54 of the substrate except for those portions directly underlying the diffusion barrier provided by silicon nitride layer 48 (FIG. 2*c*).

Thereafter the structure of FIG. 2*c* is subjected to a second oxidation process to produce thick silicon dioxide regions 60 and 62 overlying the diffused region 56 and extending to the upper level of the silicon mesas 50, 52 and 54 (FIG. 2*d*). The second oxidation step should preferably be carried out at a very high temperature so as to achieve maximum downward diffusion and minimum impurity redistribution.

Thereafter, the silicon nitride layer 48 is stripped away and n++ type regions 64 and 66 are selectively diffused into the upper surface of mesa 50 to define the source and drain regions of a field effect transistor. In addition, non-related $n$++ diffused regions 68 and 70 are respectively formed in the upper portions of mesas 52 and 54. An oxide region 72 is deposited over the structure as shown in FIG. 2*e*, and a metallic conducting film 74 is deposited over a selected area of region 72 to serve as an interconnect, for example.

As in the previously described embodiment, the field effect transistor is completed by forming a thin insulating silicon dioxide film 76 on mesa 50 which extends over the source and drain diffused regions 64 and 66, a gate electrode 78 is formed on film 76, and drain and source electrodes 80 and 82 are respectively connected to the source and drain regions.

It is to be noted that the highly diffused region 56 underlies all regions of the circuit except for the active mesa regions 50, 52 and 54. That is, the region of the substrate underlying the conducting film 74 between non-related regions 66 and 68, and non-related regions 68 and 70 all include the high concentration, low resistivity region 56. As described above with respect to the first embodiment, the arrangement of the highly diffused region of the second described embodiment creates a relatively high threshold voltage for the parasitic region and thus effectively suppresses parasitic conduction in that region. At the same time, the substrate portion underlying the active region is the low concentration, high resistivity substrate material which establishes a relatively low threshold voltage for that region. It will be understood from the above description and FIGS. 2(a) – 2(e) that the thick oxide region 72 and the underlying diffusion region 56 are inherently self-aligned with one another and are formed through a single photolithographic operation, to wit, the operation required to pattern silicon nitride layer 48 at the desired locations on the substrate. Also as described with respect to the first embodiment, a reverse bias voltage may be applied to the substrate to significantly increase the field inversion voltage associated with the parasitic regions, while at the same time hardly affecting the threshold voltage of the active devices, and resulting in only a very slight change in the junction breakdown voltages of the active diffused regions.

The integrated circuits of FIGS. 1*e* and 2*e* each includes an n-channel field-effect transistor. The invention can, however, be used to equal advantage in a p-channel configuration by changing the doping impurities of the substrate, epitaxial layer, and diffused regions to the opposite polarity. That is, in a p-channel integrated circuit, the substrate would be doped with n-type impurities and the heavily diffused regions which form the source, drain and interconnect regions would be of p-type impurities. In other respects, the p-channel integrated circuit and its method of fabrication and operation are substantially the same as that described above.

The MOS integrated circuit of the invention thus exhibits highly desirable and apparently contradictory characteristics. It has a high threshold voltage at the non-related, parasitic regions where desired, to suppress or eliminate parasitic conduction, while still providing a low threshold voltage at the active regions (e.g. field effect transistors) of the circuit as desired to achieve high-speed operation of these transistors at a relatively low level control voltage. Significantly, these characteristics can be reliably and economically obtained without the need for introducing any additional fabricating steps (e.g., masking steps) beyond those employed in an otherwise conventional process for fabricating an MOS integrated circuit.

While several embodiments of the present invention have been herein specifically described, it will be apparent that modifications may be made therein without departing from the spirit and scope of the invention.

I claim:

1. An integrated circuit comprising a semiconductor p-type substrate of a predetermined impurity concentration, first and second p-type mesas formed on said substrate, a thick oxide region completely surrounding said second mesa and extending into a major surface of said substrate, a p-type diffused layer of a substantially higher impurity concentration and lower resistivity than said substrate formed on said substrate and underlying only said thick oxide region and in self-alignment therewith, first and second n-type spaced diffused regions formed in said first mesa and an insulated electrode thereover respectively defining the source and drain regions and gate electrode of a common active field effect device, first and second contiguous portions of one of said first and second diffused regions respectively coming into contact with said substrate and with said diffused layer, an additional n-type diffused region formed in said second mesa, said additional diffused region being non-related to said active field effect device, a metal conducting layer formed on said thick oxide region and overlying said diffused layer, said additional diffused region and said metal conducting layer forming a potential parasitic device and means for applying a reverse bias voltage to said substrate, whereby the field inversion voltage of said potential parasitic device is substantially increased without materially affecting the threshold voltage of said active device, and without significantly reducing the breakdown voltage at said diffused regions.

* * * * *